(12) United States Patent
Luoh et al.

(10) Patent No.: US 8,519,541 B2
(45) Date of Patent: Aug. 27, 2013

(54) SEMICONDUCTOR DEVICE HAVING PLURAL CONDUCTIVE LAYERS DISPOSED WITHIN DIELECTRIC LAYER

(75) Inventors: Tuung Luoh, Hsinchu (TW); Chin-Ta Su, Hsinchu (TW); Ta-Hung Yang, Hsinchu (TW); Kuang-Chao Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 12/228,764

(22) Filed: Aug. 14, 2008

(65) Prior Publication Data
US 2010/0038786 A1    Feb. 18, 2010

(51) Int. Cl.
*H01L 23/532* (2006.01)

(52) U.S. Cl.
USPC .................. 257/763; 257/774; 257/E23.145

(58) Field of Classification Search
USPC .......................................... 257/770
See application file for complete search history.

(56) References Cited

U.S. PATENT DOCUMENTS

| | | | | |
|---|---|---|---|---|
| 5,049,975 A | * | 9/1991 | Ajika et al. | 257/764 |
| 5,565,708 A | * | 10/1996 | Ohsaki et al. | 257/764 |
| 6,177,338 B1 | * | 1/2001 | Liaw et al. | 438/629 |
| 6,215,186 B1 | * | 4/2001 | Konecni et al. | 257/751 |
| 2002/0070456 A1 | * | 6/2002 | Taguwa | 257/770 |
| 2008/0045010 A1 | * | 2/2008 | Wongsenakhum et al. | 438/656 |

FOREIGN PATENT DOCUMENTS

| | | |
|---|---|---|
| CN | 100570851 | 12/2009 |
| TW | 306017 | 5/1997 |
| TW | 306017 A * | 5/1997 |

OTHER PUBLICATIONS

Chinese First Examination Report of China Application No. 200910126070.0, dated Jul. 30, 2010.
Chinese Second Examination Report of China Application No. 200910126070.0, dated May 4, 2011.

* cited by examiner

*Primary Examiner* — Stephen W Smoot
(74) *Attorney, Agent, or Firm* — J.C. Patents

(57) ABSTRACT

A method for manufacturing a semiconductor device is disclosed. A semiconductor substrate such as bare silicon is provided, and a dielectric layer is formed over the semiconductor substrate. An opening is provided within the dielectric layer by removing a portion of the dielectric layer. A conformal first conductive layer is formed over the dielectric layer and the opening. A conformal second conductive layer is formed over the first conductive layer. A conformal barrier layer is formed over the second conductive layer.

10 Claims, 10 Drawing Sheets

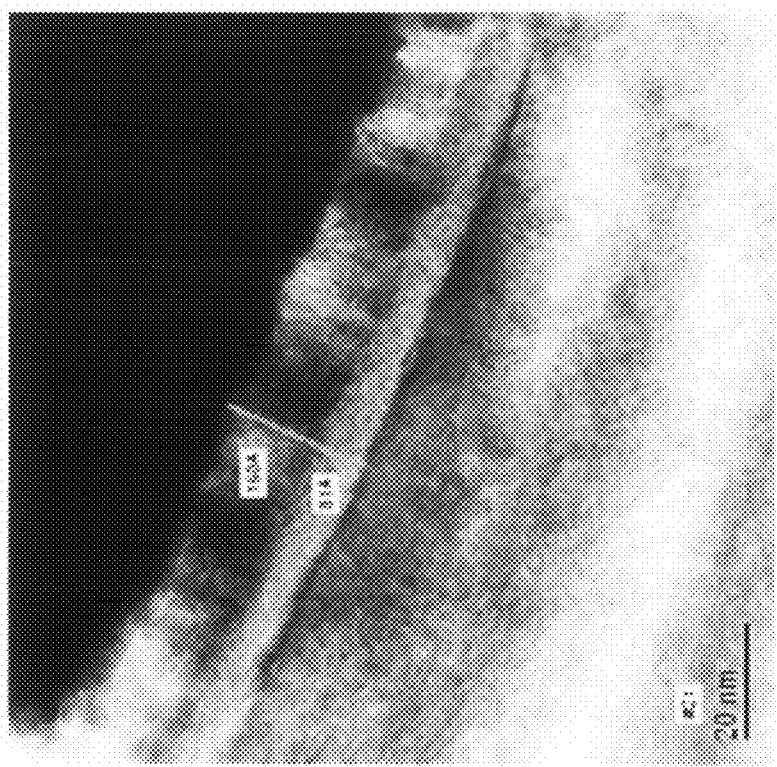

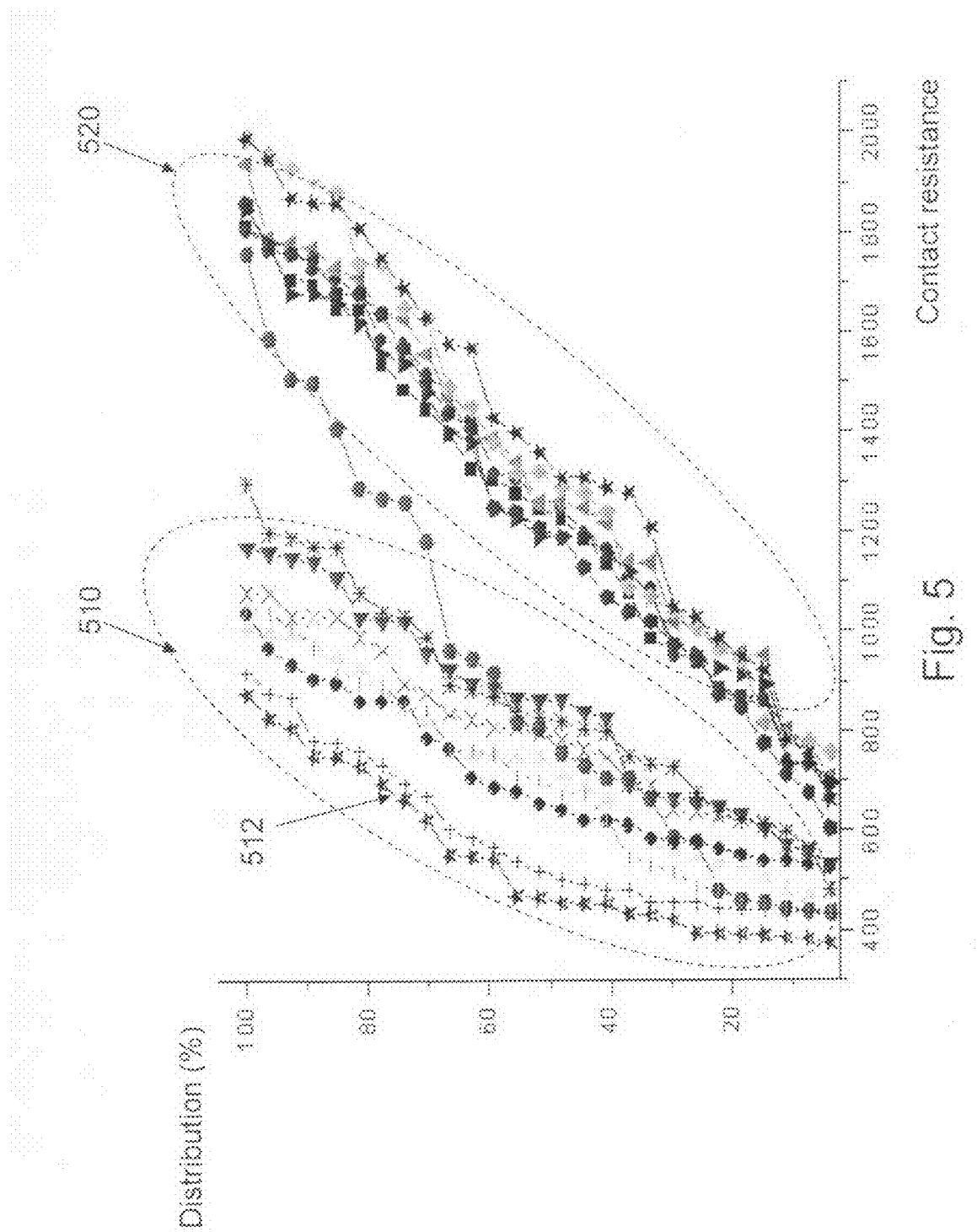

SEMICONDUCTOR DEVICE HAVING PLURAL CONDUCTIVE LAYERS DISPOSED WITHIN DIELECTRIC LAYER

TECHNICAL FIELD

The invention relates generally to a method for manufacturing a semiconductor device, and more particularly, to a method for manufacturing a contact barrier layer of a semiconductor device.

BACKGROUND

There has been a trend in the semiconductor industry in increasing the packaging density of wafers. The high integration level of semiconductor ICs has been achieved by reducing the device dimension. Similar to other aspects of integrated circuit processing, the technology for fabricating contacts has to evolve in order to keep up with the pace of other advancements in the process sequence.

A contact in a semiconductor integrated circuit allows electrical connection between metal conductors and circuit elements in the semiconductor integrated circuit substrate. In a common application for integrated circuit fabrication, a dielectric layer is formed on a semiconductor substrate. A contact opening is etched through the dielectric layer to the semiconductor substrate. The contact opening is then filled with a conductive material (e.g., titanium) to provide an electrical connection between the metal conductors and the circuit elements. In order to prevent chemical reactions between the metal conductor and the substrate or between the metal conductors, a barrier layer used as a barrier, such as a titanium nitride layer, is deposited over the conductive layer.

A well known process for depositing metal films is chemical vapor deposition (CVD). A commonly used method of forming a contact involves the application of a chemical vapor deposition titanium (Ti) process followed by a chemical vapor deposition titanium nitride (TiN) process. The CVD Ti deposition process is conducted at a high temperature, for example between about 500° C. and 650° C., so that titanium silicide ($TiSi_2$) forms immediately when Ti layer is deposited. FIGS. 1A and 1B illustrate a method for manufacturing a contact. As shown in FIG. 1A, a semiconductor substrate 102 with a dielectric layer 104 and an opening 106 are provided. A titanium layer 110 is then deposited by plasma enhanced chemical vapor deposition (PECVD) as shown in FIG. 1B. Further, a titanium nitride barrier layer 114 is deposited prior to deposition of certain metal conductors 116 such as aluminum or tungsten. Titanium nitride layer 114 is deposited by a chemical vapor deposition process. A titanium silicide region 112 is formed due to the reaction of titanium with silicon.

SUMMARY OF INVENTION

In one embodiment of the present invention, a method for manufacturing a semiconductor device is disclosed. A semiconductor substrate such as bare silicon is provided, and a dielectric layer is formed over the semiconductor substrate. An opening is provided within the dielectric layer by removing a portion of the dielectric layer. A conformal first conductive layer is formed over the dielectric layer and the opening. A conformal second conductive layer is formed over the first conductive layer. A conformal barrier layer is formed over the second conductive layer.

In another embodiment of the present invention, a semiconductor substrate, such as bare silicon is provided, and a dielectric layer is formed over the semiconductor substrate. An opening is provided within the dielectric layer by removing a portion of the dielectric layer. A conformal first conductive layer is formed over the dielectric layer and the opening. An optional barrier layer is formed over the first conductive layer. A conformal second conductive layer is formed over the optional barrier layer. A conformal barrier layer is formed over the second conductive layer.

Still another embodiment of the present invention, a semiconductor substrate, such as bare silicon is provided, and a dielectric layer is formed over the semiconductor substrate. An opening is provided within the dielectric layer by removing a portion of the dielectric layer. A conformal first conductive layer is formed over the dielectric layer and the opening. An optional barrier layer is formed over the first conductive layer. A conformal barrier layer is formed over the optional barrier layer.

BRIEF DESCRIPTION OF DRAWINGS

The foregoing summary, as well as the following detailed description, will be better understood when read in conjunction with the appended, exemplary drawings. It should be understood, however, that the invention is not limited to the precise arrangements and instrumentalities shown.

FIG. 3A is a SEM picture of a contact barrier layer of a semiconductor device according to an embodiment of the invention.

FIG. 5 is a graph illustrating the contact resistance distribution according to one embodiment of the present invention.

DETAILED DESCRIPTION

Reference will now be made in detail to the exemplary embodiments of the invention illustrated in the accompanying drawings. Wherever possible, the same reference numbers will be used throughout the drawings to refer to the same or like. The following example embodiment shown in FIGS. 2A-2C discloses a method of manufacturing a contact by forming a first titanium layer by applying a physical vapor deposition (PVD) process followed by forming a second titanium layer by applying a plasma enhanced chemical vapor deposition (PECVD) process, and forming a titanium nitride (TiN) layer using a chemical vapor deposition (CVD) process to obtain a contact barrier layer with conformal step coverage and without overhang. The method of manufacturing a contact is described in further detail below.

Figure 1A:
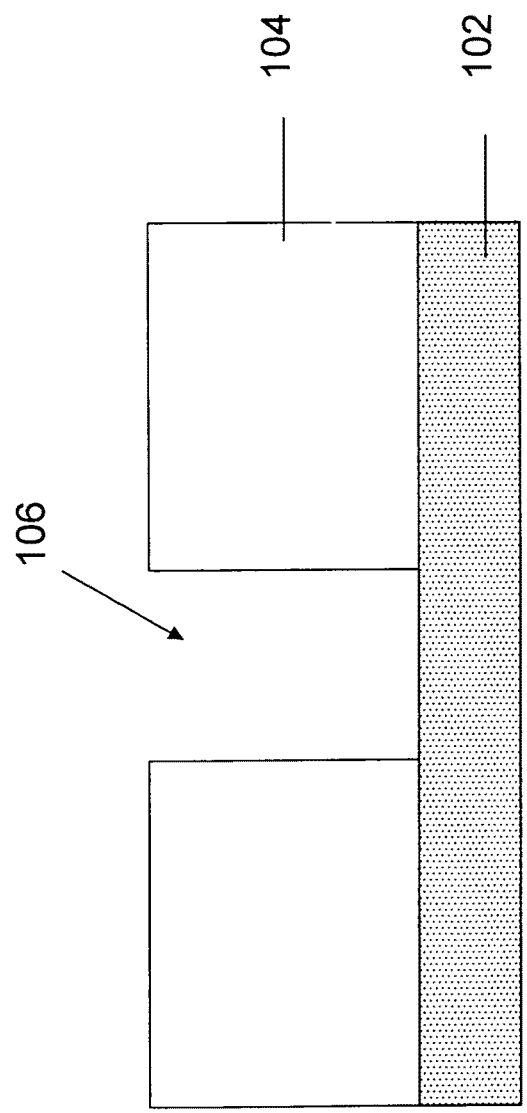
FIGS. 1A to 1B are cross-sectional views illustrating a method for manufacturing a contact in the prior art.
Figure 1B:
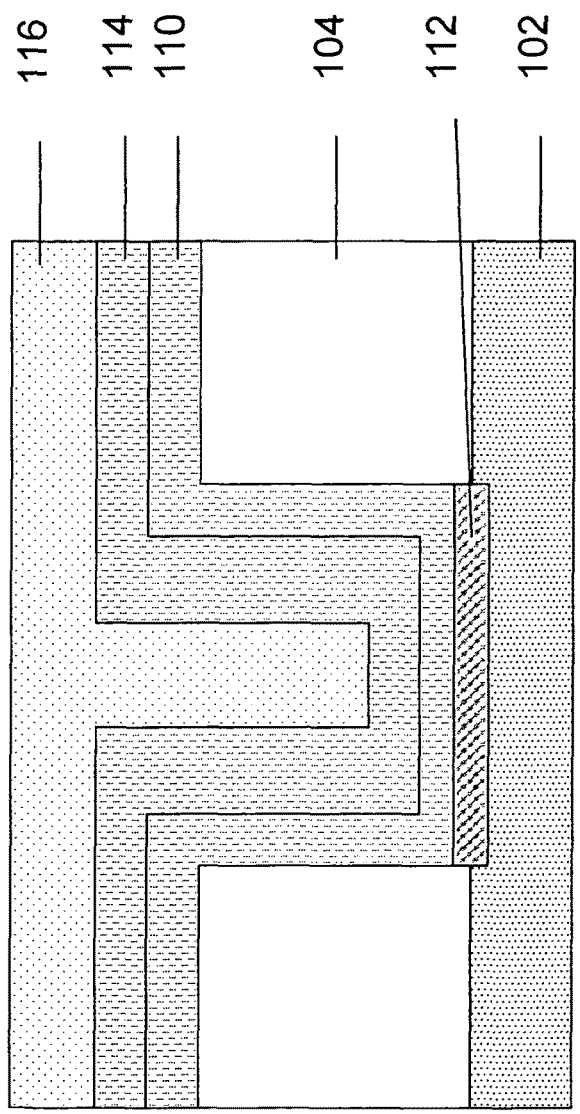
Figure 2A:
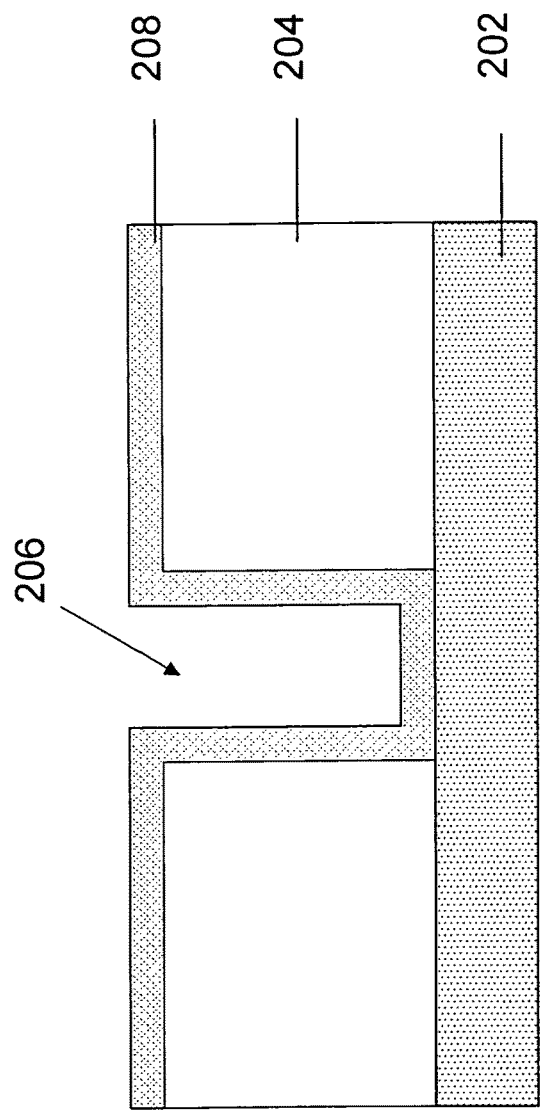
FIGS. 2A-2C are cross-sectional views illustrating a method for manufacturing a contact barrier layer of a semiconductor device according to one embodiment of the present invention.

Referring to FIG. 2A, a semiconductor substrate 202 is provided. The semiconductor substrate 202 may be subjected to an ion-implantation process, thereby forming a heavily doped region (not shown), e.g., a $P^+$ well. A dielectric layer 204 is deposited or formed over the semiconductor substrate 202. The semiconductor substrate 202 is typically bare silicon, but may be SiGe, or other semiconductor materials. A portion of the dielectric layer 204 is selectively removed to provide an opening 206 within the dielectric layer 204. The opening 206 may be patterned on the dielectric layer 204 by any of the various photolithography processes.

After the opening 206 is provided, the semiconductor device is loaded into a physical vapor deposition (PVD) process chamber. In some embodiments, the PVD process chamber may be an ionized metal plasma (IMP) PVD process chamber or a self-ionized plasma (SIP) PVD process chamber. As illustrated in FIG. 2A, a first conductive layer 208, for example, a first titanium layer (Ti layer) 208, is formed, and the first conductive layer 208 may have a thickness between about 5 and 30 Angstroms, for example. In some other embodiments, the thickness of the first titanium layer 208 may be within a range of 5 to 20 Angstroms, or may be within a range of about 10 Angstroms to about 15 Angstroms. The first titanium layer 208 is formed over the dielectric layer 204 as well as the opening 206 by applying the IMP PVD process (i.e. IMP PVD Ti process). The formation of the first titanium layer 208 is achieved at a temperature, for example, within a range of 0° C. to 400° C., or within a range of 25° C. to 300° C. According to various applications, to obtain a conformal conductive layer 208, the temperature may vary depending on the thickness of the conductive layer 208.

In contrast with the deposition of the Ti layer using a chemical vapor deposition (CVD) process (i.e., CVD Ti process), a titanium silicide ($TiSi_2$) layer is not formed simultaneously with the Ti layer during the PVD process. In other words, the reaction of Ti with silicon (Si) at the temperature of the PVD process may not be as active as the corresponding reaction associated with the CVD Ti process. Hence, the formation of the conformal first Ti layer 208 over the dielectric layer 204 is resulted. The IMP PVD Ti process is able to provide more uniform contact resistances by performing a relatively easier control deposition process in contrast with the CVD Ti process.

Figure 2B:
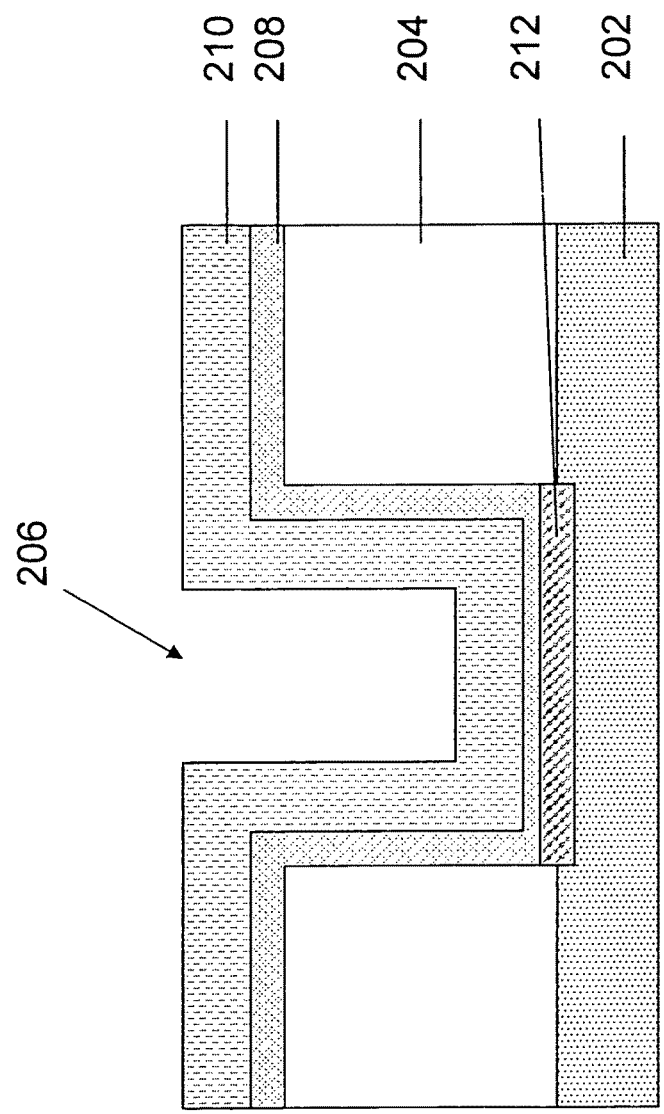

As the size of the semiconductor devices continuously decreases to the sub-micron range, the aspect ratio (i.e., the ratio of contact hole depth to contact hole width) of contact holes is increased, and the step coverage (i.e., the ratio of film thickness on the bottom of the contact hole to the film thickness on the sides of the contact hole) issue for the contact hole becomes a bottleneck. In order to improve step coverage and reduce overhang (i.e., the amount of material deposited at the top corners of the contact hole, which limits the amount of material that can be deposited within the contact hole), a second conductive layer 210, for example, a second Ti layer 210, is formed over the first conductive layer 208 as shown in FIG. 2B. For forming the second Ti layer 210, the semiconductor device is transferred from the PVD chamber to a chemical vapor deposition (CVD) chamber (e.g., a plasma enhanced chemical vapor deposition (PECVD) chamber). The surface of the first Ti layer 208 is exposed to the atmosphere during the transfer because the vacuum is broken. Such intake of oxygen may cause the surface resistance of the first Ti layer 208 to rise; thus, the RC value of the IC device increases. However, in this embodiment, Ti from the second Ti layer 210 formed after the CVD process may absorb the atmospheric oxygen, which then lead to the second Ti layer 210 to have stable properties (e.g. film resistance, proper thickness and good conformity).

During the formation of the second Ti layer 210, a source gas (e.g., $TiCl_4$) is introduced to the CVD chamber. The second Ti layer 210 may be formed to a thickness between about 5-400 Angstroms, preferably between a range of 5-200 Angstroms, or a range of 50-100 Angstroms. The temperature at which the formation of the second Ti layer 210 is conducted may be controlled between about 350° C. to 650° C., or between a preferable range of 500° C.-650° C. In some exemplary embodiments, the temperature may be within a range of 600° C.-650° C. depending on the applications. Since the CVD process for forming the second Ti layer 210 is performed at a high temperature, a portion of the first Ti layer 208 may react with the substrate material, thereby forming a titanium silicide ($TiSi_2$) layer 212 with low resistance on the portion of the semiconductor substrate 202 exposed by the opening 206. A larger process window for the formation of the $TiSi_2$ layer 212 may therefore be obtained due to the inert reaction of titanium (from the first Ti layer 208) with silicon (from the semiconductor substrate 202), which may improve the thermal stability of the $TiSi_2$ layer 212.

Figure 2C:
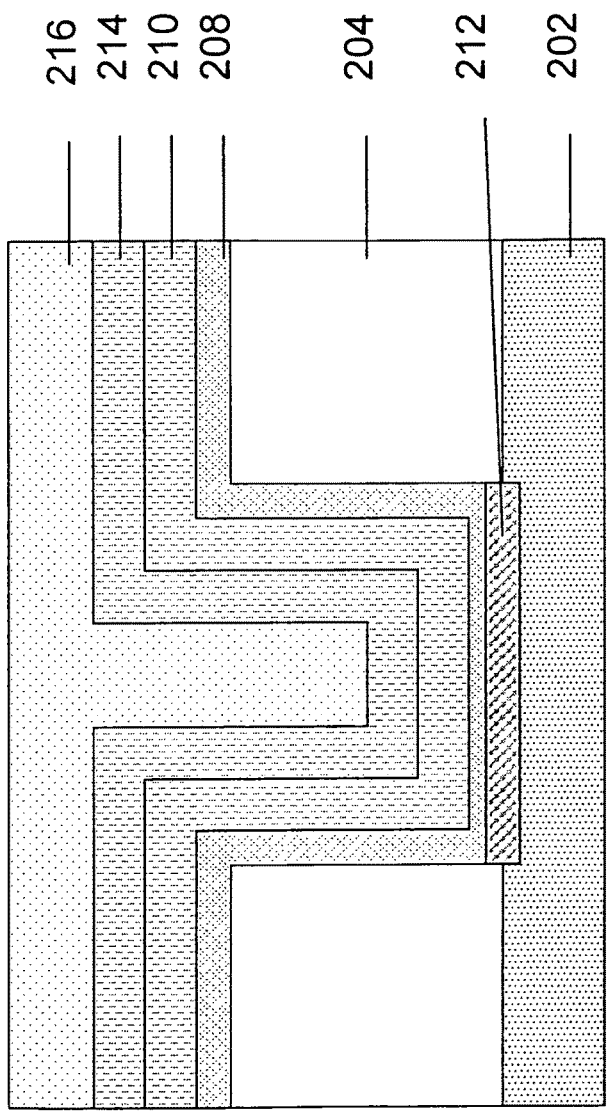

In order to prevent chemical reactions between the metal conductor and the substrate or between the metal conductors, a barrier layer 214 is formed over the second Ti layer 210 as a barrier using the CVD process as illustrated in FIG. 2C. In one example, titanium chloride ($TiCl_4$) as a titanium source gas and ammonia ($NH_3$) as a reactant gas are supplied at a predetermined flow rate to form a titanium nitride (TiN) layer as the barrier layer 214. In this manner, titanium nitride (TiN) is formed from titanium chloride ($TiCl_4$) in reaction with ammonia ($NH_3$). In an alternative example embodiment, a tantalum nitride (TaN) layer may serve as the barrier layer formed by using $TiCl_5$ as a titanium source. In various embodiments, a tungsten nitride (WN) layer or a titanium tungsten (TiW) layer may serve as the barrier layer 214. In one embodiment, the barrier layer 214 has a thickness between about 5 and 500 Angstroms. In various embodiments, the thickness of the barrier layer 214 may be between a range of 50 and 200 Angstroms or 70 and 150 Angstroms. The CVD process may be performed at a temperature ranging from to 350° C. to 700° C. In other example embodiments, the temperature may range from 400° C. to 650° C. or preferably, from 600° C. to 650° C. Depending on applications, the thickness of the barrier layer and the temperature of the formation may vary and optimize.

As shown in FIGS. 2A-2C, a first Ti layer 208 is formed over the dielectric layer 204 and the opening 206 using a PVD process and a second Ti layer 210 is formed over the first Ti layer 208 by applying a CVD process. Subsequently, a barrier layer 214 (e.g., TiN or TaN layer) is formed over the second Ti layer 210 using a CVD process. This combination of material layers may provide superior bottom coverage in addition to providing improved conformal TiN/TaN layer coverage. Referring to FIG. 2C again, a metal layer 216 is formed over the barrier layer 214 to fill the opening 206.

An optional thermal treatment (e.g., a rapid thermal process (RTP)) may be provided after the formation of the barrier layer 214. The semiconductor device may be put in a chamber in which nitrogen is provided at a temperature between about 500° C. and 700° C. In various exemplary embodiments, the temperature may range from 550° C. to 650° C. or 600° C. to 650° C. In one exemplary embodiment, the thermal treatment may last about 20-180 seconds. In other embodiments, the thermal treatment may be conducted for 30-120 seconds or 40-60 seconds.

Figure 3:
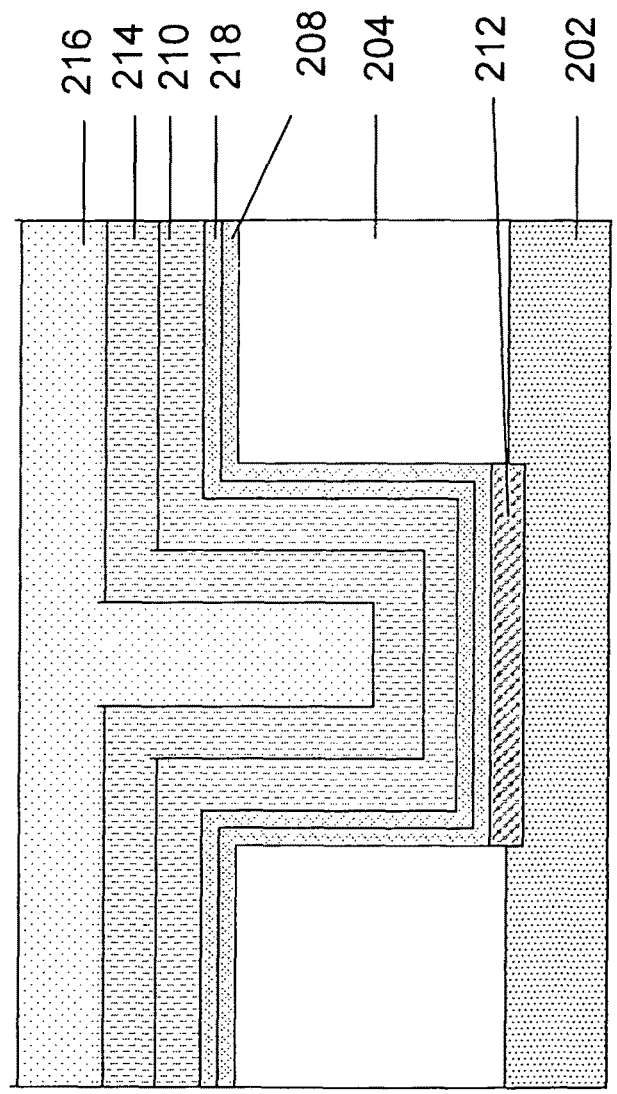
FIG. 3 is cross-sectional view illustrating a method for manufacturing a contact barrier layer of a semiconductor device according to another embodiment of the present invention.
Figure 3B:
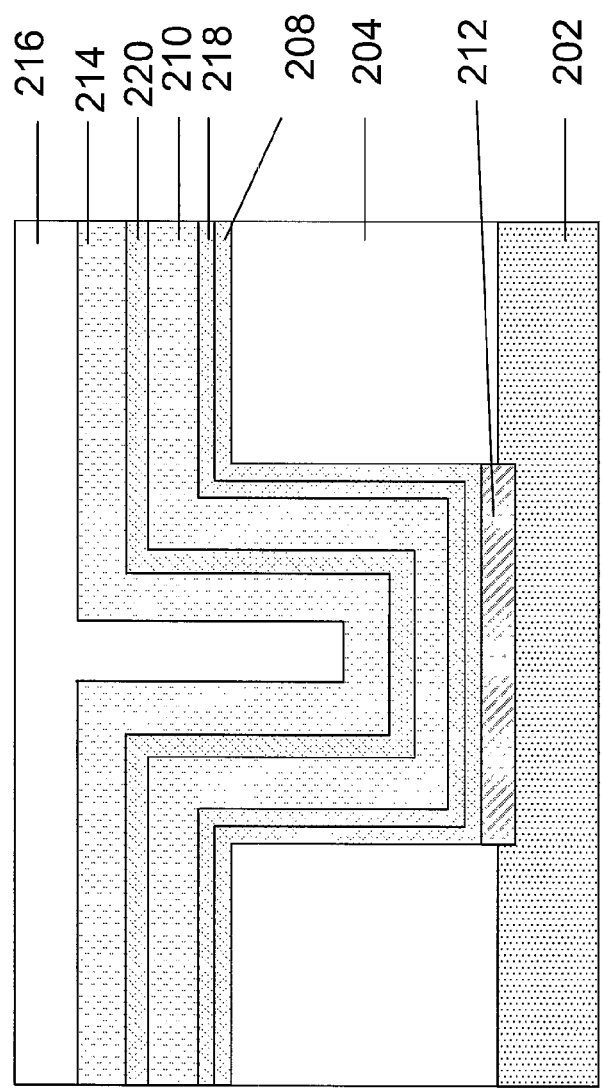
FIG. 3B is a cross-sectional view illustrating a method for manufacturing a contact barrier of a semiconductor device according to another embodiment of the present invention.

The performance of the bather layer 214 may be improved by forming an additional optional barrier layer 218 sandwiched between the first conductive layer 208 and the second conductive layer 210, as illustrated in FIG. 3. In one embodiment, a deposition of titanium nitride (TiN) is accomplished using precursors, such as tetrakis(dimethylamino)titanium (TDEAT), tetrakis(dimethylamino)titanium (TDMAT), tetrakis(ethylmethylamido)titanium (TEMAT) or mixtures thereof, in a reaction with ammonia ($NH_3$) under the metal-organic chemical vapor deposition (MOCVD) conditions of 350 to 550° C. The optional barrier layer 218 may be subjected to nitrogen ($N_2$) or helium (He) plasma treatment by flowing He at a predetermined rate into the chamber where radio frequency (RF) energy is applied at about 500 to 1000 watts to form the plasma. Alternatively, the deposition of titanium nitride (TiN) may be sputtered using a self-ionized plasma (SIP) method under a room temperature of 400° C. with titanium and nitrogen as a source gas and a reaction source, respectively. FIG. 3A is a picture taken by SEM (Scanning Electron Microscope) showing the structure of a contact barrier layer according to an embodiment of the invention. As shown in FIG. 3A, the contact barrier layer includes an IMP PVD titanium layer of about 80 angstrom thick, a MOCVD titanium nitride layer of about 25 angstroms thick and a $TiCl_4$ CVD titanium nitride layer of about 160 angstroms thick. Further, the $TiCl_4$ CVD titanium nitride layer has a columnar structure. Moreover, the above contact barrier layer shown in FIG. 3A has been subjected to the optional rapid thermal process at about 650° C. In another exemplary embodiment, as shown in FIG. 3B, an additional conductive layer 220 may be disposed between the second conductive layer 210 and the barrier layer 214.

Figure 4:
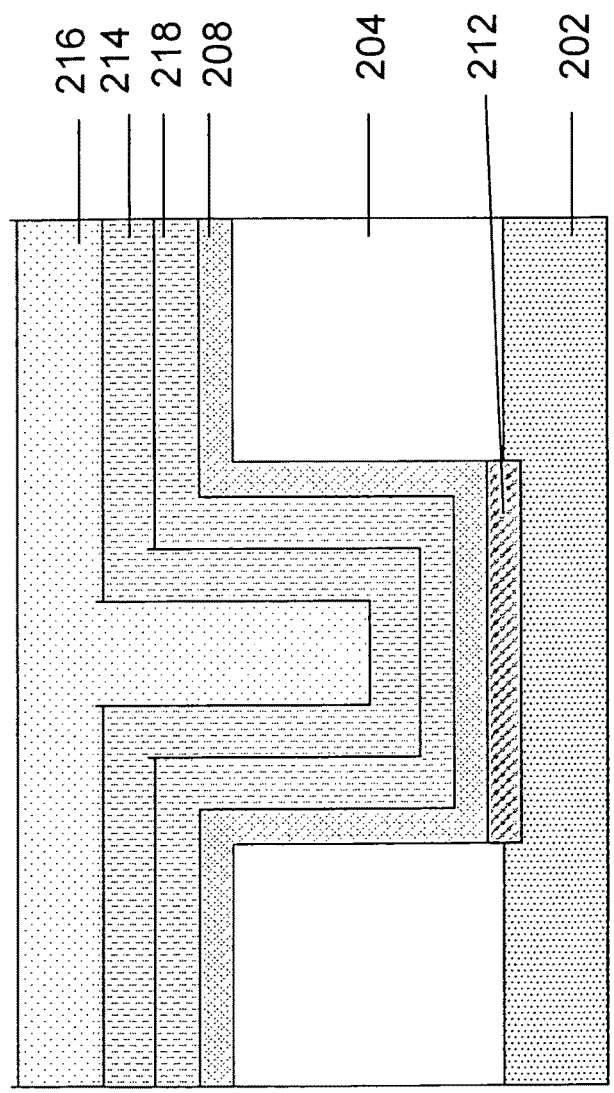
FIG. 4 is cross-sectional view illustrating a method for manufacturing a contact barrier layer of a semiconductor device according to another embodiment of the present invention.

In an alternative embodiment as illustrated in FIG. 4, a conformal barrier layer 214 may be produced by forming a first conductive layer 208 over the dielectric layer 204 and the opening 206 using a PVD process with a thickness between about 10 and 400 Angstroms, preferably between about 200 and 300 Angstroms.

Then, prior to forming the barrier layer 214, an optional barrier layer 218 is formed over the first conductive layer 208 by applying a self-ionized plasma sputtering process or a metal-organic chemical vapor deposition to a thickness of 5 to 100 Angstroms, preferably 10 to 50 Angstroms.

An optional thermal treatment (e.g., a rapid thermal process (RTP)) may be provided after the formation of the optional barrier layer 218. The semiconductor device may be put in a chamber in which nitrogen at a temperature between about 500° C. and 700° C. is provided. In various example embodiments, the range of the temperature may range from 550° C. to 650° C. or 600° C. to 650° C.

Subsequently, the barrier layer 214 (e.g., TiN or TaN layer) is formed over the optional barrier layer 218 using a CVD process. The barrier layer 214 may have a thickness of 20-200 Angstroms or a thickness of 40 to 100 Angstroms in another embodiment. This combination of the material layers may provide smooth bottom coverage; thus conformal barrier layer is provided. A metal layer 216 is then formed over the barrier layer 214 to fill the opening 206.

FIG. 5 is a graph illustrating the contact resistance distribution according to one embodiment of the present invention. Here, the x-axis indicates contact resistance (in ohm), and the y-axis indicates the distribution (%).

As shown in the graph of FIG. 5, the curves within 520 show that the P+/N resistance is increased so as to form a relatively longer tail shape in contrast with curves within 510. The curve 512 shows the resistance obtained under the condition that the first Ti layer 208 is formed to a thickness of 5~30 Angstroms using an IMP PVD process, the second Ti layer 210 is formed to a thickness of 5~400 Angstroms over the first Ti layer 208 using a PECVD process and the barrier layer of TiN 214 is formed to a thickness of 5~500 Angstroms over the second Ti layer 214 according to one example embodiment of the present invention.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

What is claimed is:

1. A semiconductor device, comprising:
    a substrate;
    a dielectric layer, having an opening configured therein, disposed on the substrate;
    a first conductive titanium layer, disposed on the substrate and in the opening;
    a second conductive titanium layer, disposed directly on the first conductive titanium layer; and
    a barrier layer, disposed on the second conductive titanium layer.

2. The semiconductor device of claim 1, wherein the barrier layer comprises a columnar structure.

3. The semiconductor device of claim 1 comprising an additional conductive layer disposed between the second conductive layer and the barrier layer.

4. The semiconductor device of claim 3, wherein the additional conductive layer comprises a titanium layer formed with titanium chloride ($TiCl_4$) and ammonia ($NH_3$).

5. The semiconductor device of claim 1, wherein the first conductive layer comprises a titanium layer formed with ionized metal plasma (IMP) PVD.

6. The semiconductor device of claim 1, wherein the second conductive layer comprises a titanium layer formed with titanium chloride ($TiCl_4$).

7. The semiconductor device of claim 1, wherein the barrier layer comprises a titanium nitride layer formed with titanium chloride ($TiCl_4$).

8. The semiconductor device of claim 1, wherein the first conductive layer is about 10 to 400 angstroms thick.

9. The semiconductor device of claim 1, wherein the second conductive layer is about 5 to 100 angstroms thick.

10. The semiconductor device of claim 1, wherein the barrier layer is about 20 to 200 angstroms thick.

* * * * *